United States Patent [19]
Imoto

[11] Patent Number: 6,111,423
[45] Date of Patent: Aug. 29, 2000

[54] METHOD AND APPARATUS FOR MEASURING PINCH-OFF VOLTAGE OF A FIELD EFFECT TRANSISTOR

[75] Inventor: Tsutomu Imoto, Kanagawa, Japan

[73] Assignee: Sony Corporation, Tokyo, Japan

[21] Appl. No.: 09/055,742

[22] Filed: Apr. 7, 1998

[30] Foreign Application Priority Data

Apr. 9, 1997 [JP] Japan .................. P09-090768

[51] Int. Cl.[7] .................................................. G01R 31/26
[52] U.S. Cl. ...................... 324/769; 324/765; 324/766
[58] Field of Search .................................. 324/765, 766, 324/769, 713, 719

[56] References Cited

U.S. PATENT DOCUMENTS

| | | | |
|---|---|---|---|
| 3,648,170 | 3/1972 | Embree et al. | 324/769 |
| 4,638,341 | 1/1987 | Baier et al. | 357/15 |

*Primary Examiner*—Glenn W. Brown
*Attorney, Agent, or Firm*—Hill & Simpson

[57] ABSTRACT

A pinch-off voltage measurement circuit for measuring the pinch-off voltage of a field effect transistor. The circuit uses a measuring capacitor and connection circuit. A voltage is applied to the transistor and an impedance change is detected via the connection circuit. The connection circuit includes first and second detection terminals to which a measuring means is connected, one side of a measuring capacitor being connected to one of the detection terminals; a first element connection terminal to which one of the source and drain of said field effect transistor is connected; a second element connection terminal to which the other of the source and drain is connected; and a third element connection terminal to which the gate is connected, the one detection terminal to which said measuring capacitor is connected and the third element connection terminal are short-circuited, an opposite side of said measuring capacitor is connected to one of said first element connection terminal and the second element connection terminal and having a capacitance value sufficiently larger than the transistor capacitance between the source or drain and the gate in said field effect transistor.

11 Claims, 12 Drawing Sheets

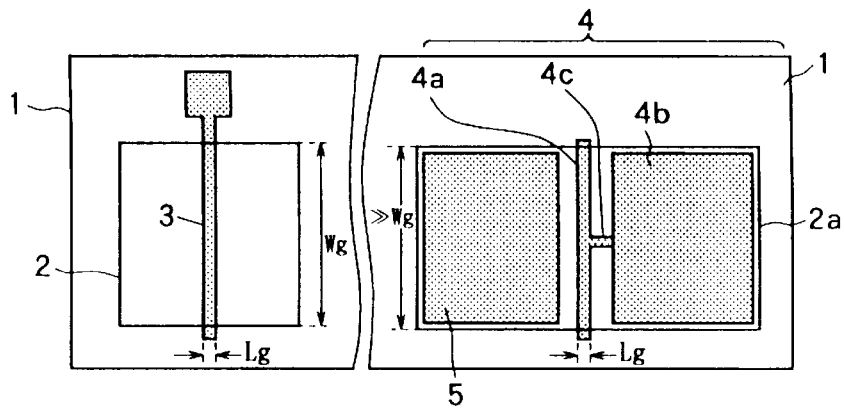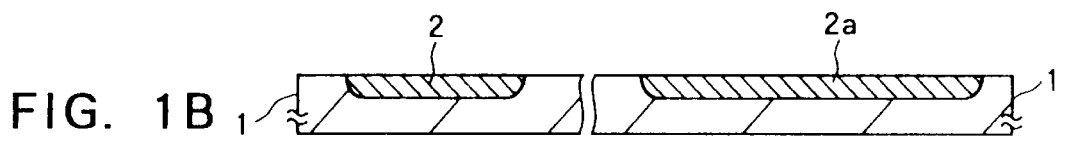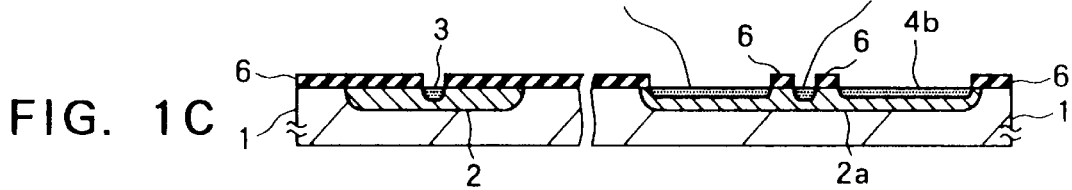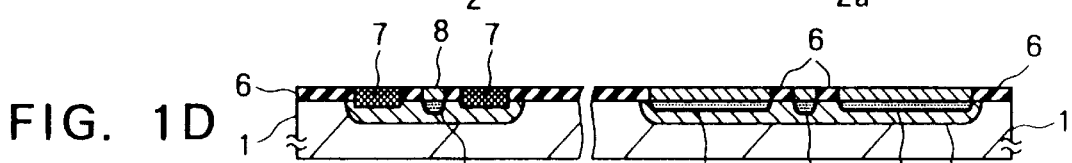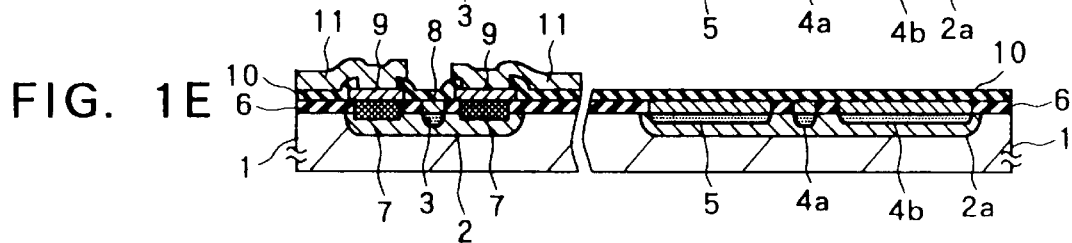

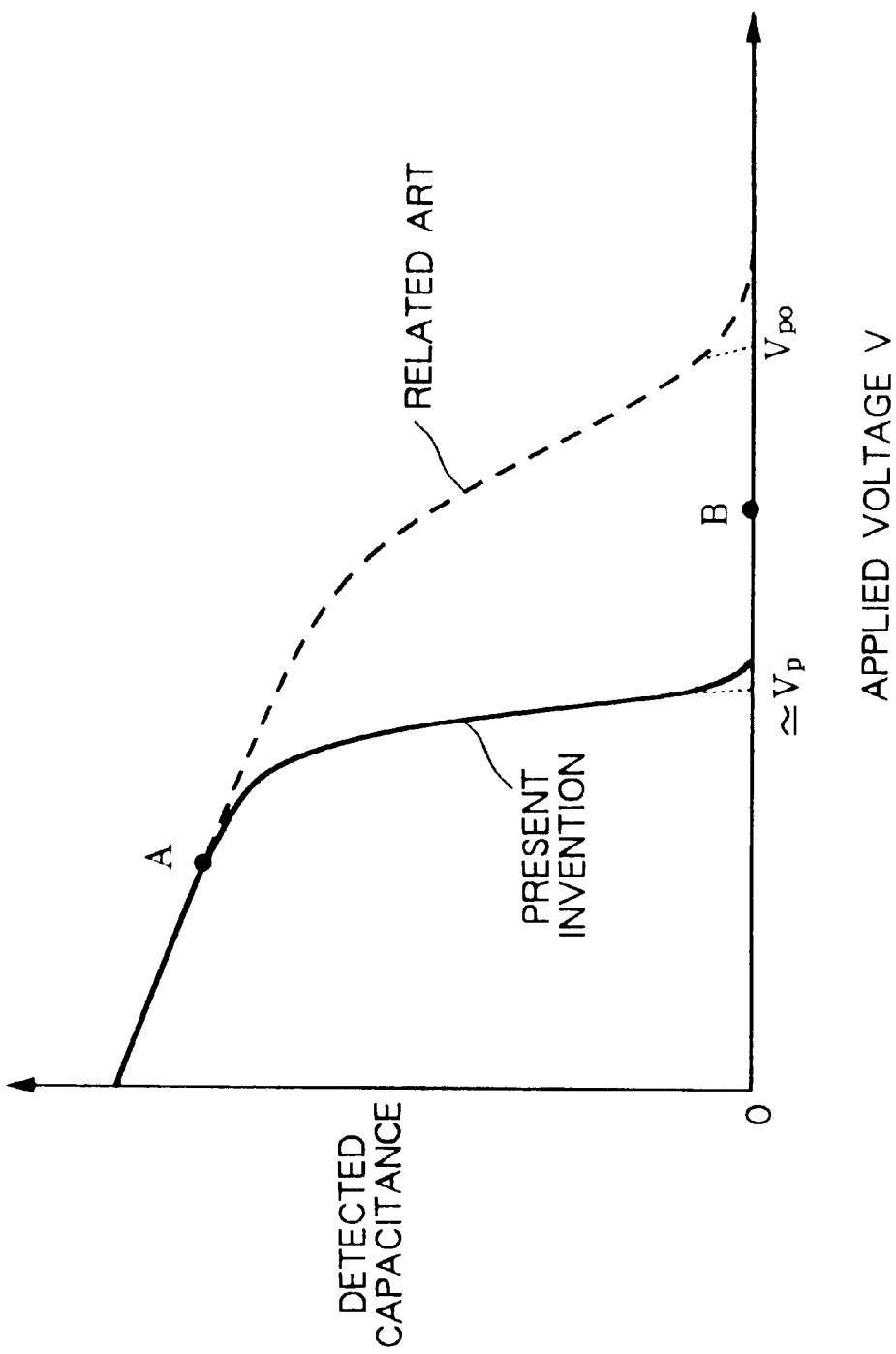

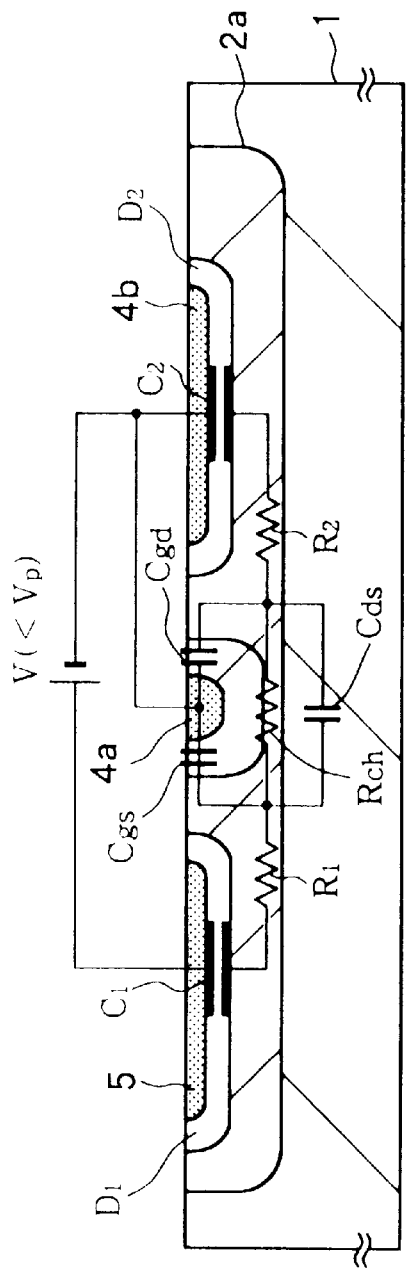
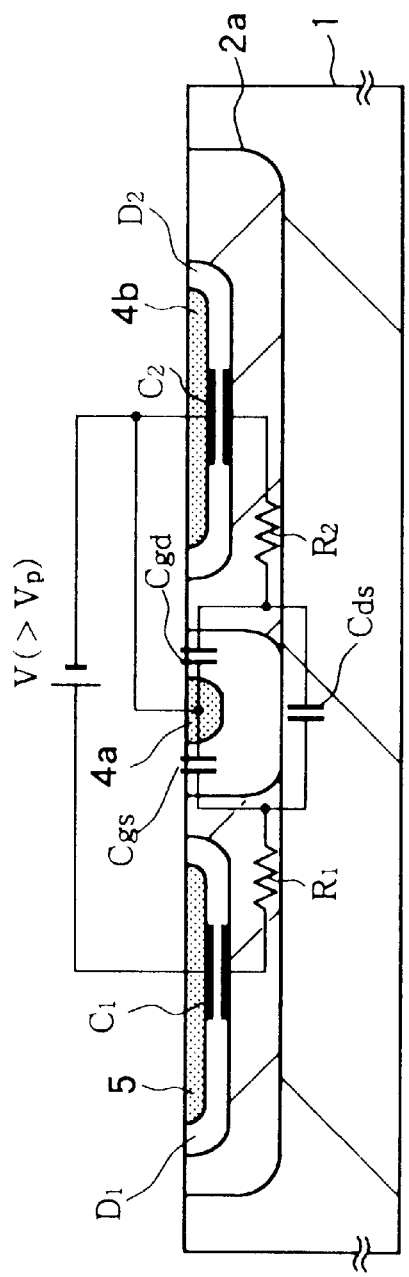
FIG. 3A
FIG. 3B

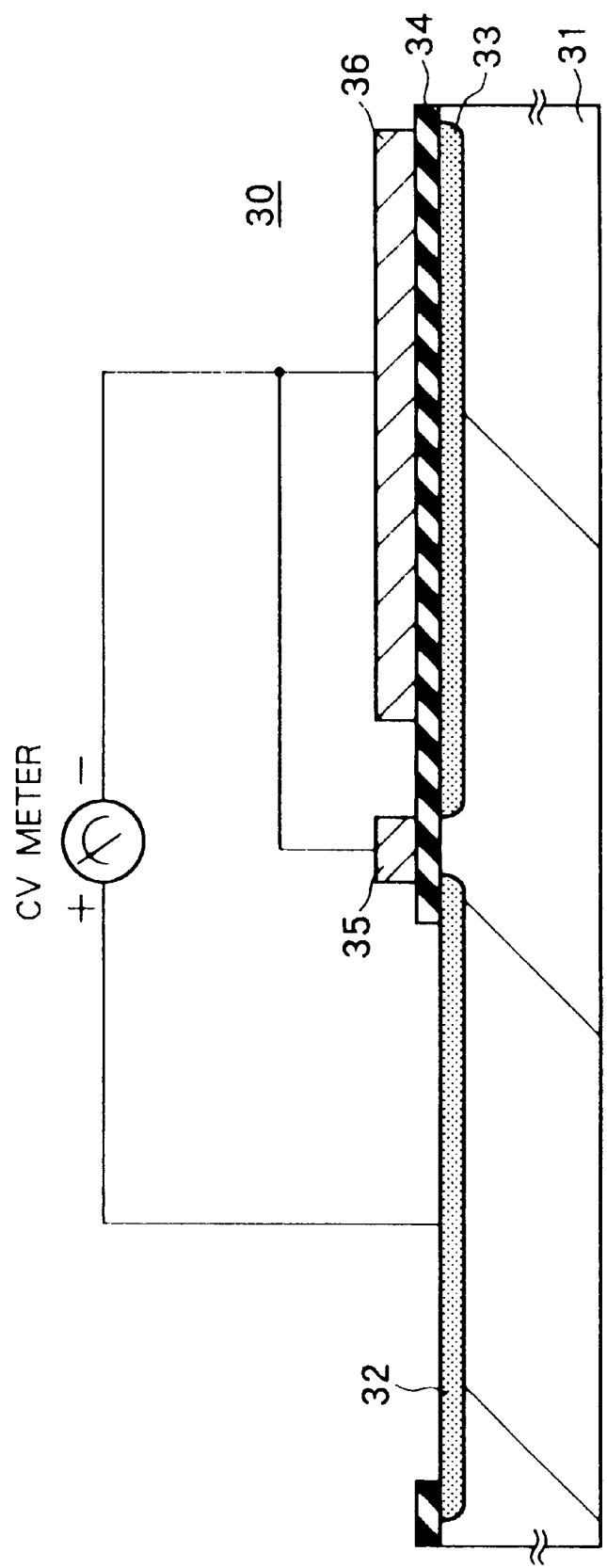

FIG. 10A (PRIOR ART)
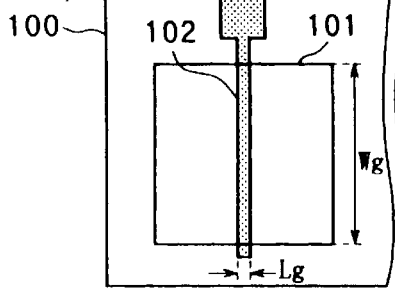
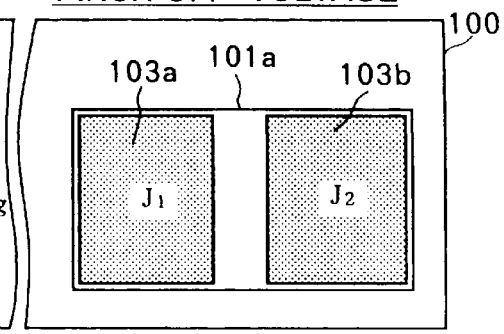
FIG. 10B (PRIOR ART)
FIG. 10C (PRIOR ART)
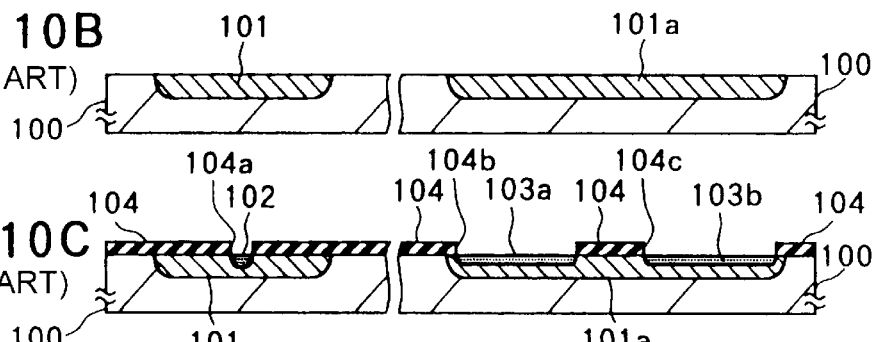
FIG. 10D (PRIOR ART)
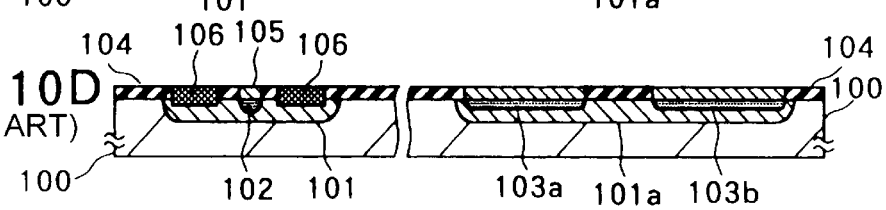
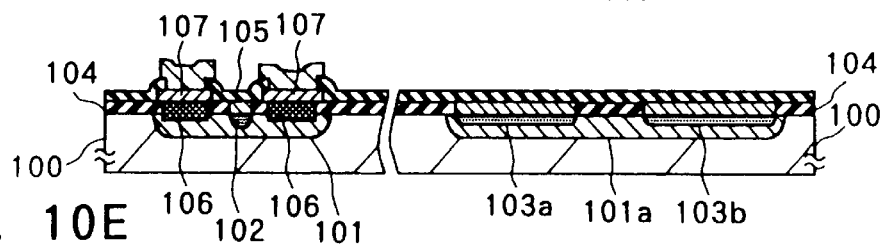
FIG. 10E (PRIOR ART)

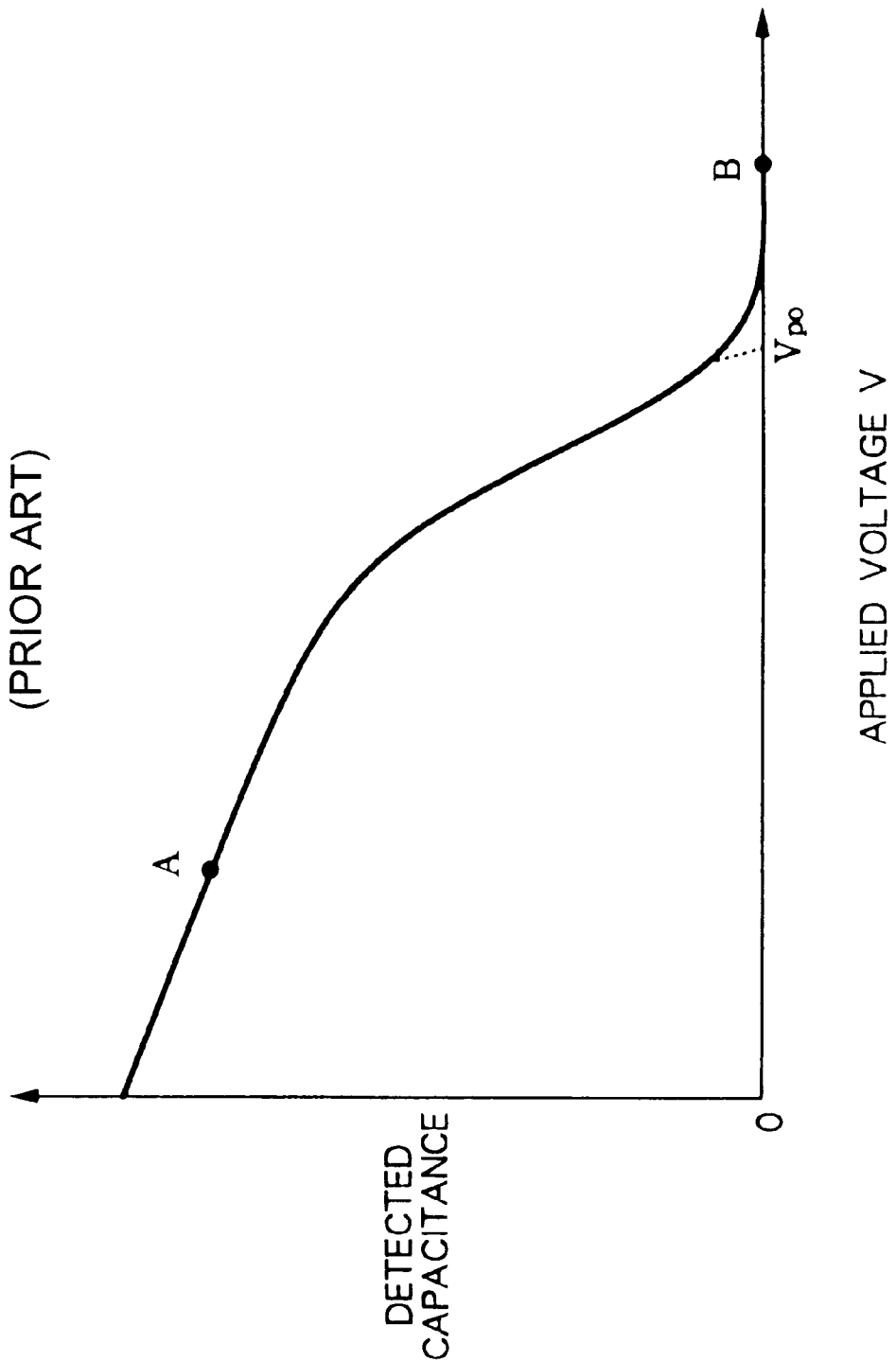

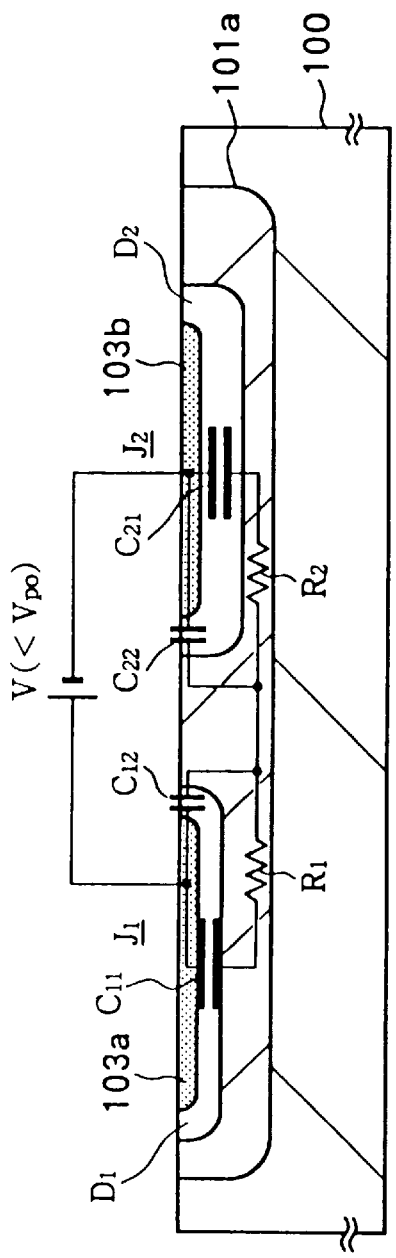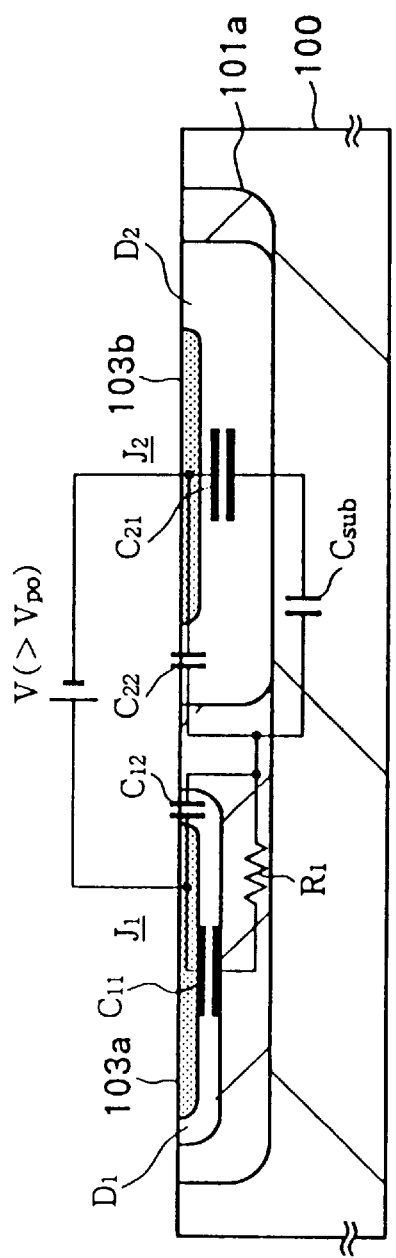
FIG. 12A (PRIOR ART)
FIG. 12B (PRIOR ART)

METHOD AND APPARATUS FOR MEASURING PINCH-OFF VOLTAGE OF A FIELD EFFECT TRANSISTOR

BACKGROUND OF THE INVENTION

1. Field of the Invention

The present invention relates to a measurement circuit, a measurement transistor, and measurement method capable of measuring a pinch-off voltage of a gate of a field effect transistor with a high precision. Further, the present invention relates to a method of manufacturing a junction field effect transistor using this measurement transistor to enable monitoring the pinch-off voltage of the junction field effect transistor formed on the same substrate and control of the gate threshold voltage after completion to a desired value.

2. Description of the Related Art

When forming a field effect transistor such as a metal-semiconductor field effect transistor (MESFET) and a junction field effect transistor (JFET) on a GaAs or other compound semiconductor substrate, for example, how precisely a gate threshold voltage Vth can be controlled is one of most important factors for determining the improvement of the manufacturing yield and the quality of the circuit characteristics.

For this reason, the method of monitoring the gate threshold voltage Vth in the middle of the wafer process and controlling the gate threshold voltage Vth after completion of the field effect transistor has been conventionally adopted as a procedure for enhancing the precision of control of the gate threshold voltage Vth.

When forming a junction field effect transistor on a GaAs substrate, first an n-type impurity diffusion region (channel forming impurity region) in which the channel is to be formed is formed on the surface side an a semi-insulating GaAs substrate, then a silicon nitride film or other film is formed on the entire surface. Next, a gate electrode forming portion is opened in this silicon nitride film to partially expose the channel forming impurity region, a p-type impurity is introduced via this open portion and the impurity is diffused in the channel forming impurity region to form the gate impurity region, which determines the gate threshold voltage Vth, while controlling the impurity concentration, depth, etc. thereof.

At the time of the diffusion when forming the gate impurity region, however, the substrate is exposed to a high temperature, therefore some ohmic electrodes having a low heat resistance such as AuGe/Ni cannot be provided in advance on the substrate and therefore the gate threshold voltage Vth must be controlled before the formation of the ohmic electrodes. For this reason, ohmic contacts with the channel forming impurity region cannot be obtained, therefore the gate threshold voltage Vth, which is defined by the characteristic of a drain current Id with respect to a voltage Vg applied between the source and drain under a predetermined drain bias (hereinafter, simply referred to as a "current-voltage characteristic"), cannot be measured. The situation is the same in the case of a MESFET as well if the gate threshold voltage Vth is measured before forming the ohmic electrodes.

Therefore, wide use has been made of the method of measurement of a pinch-off voltage Vp for measuring a change of capacitance of wide measurement patterns formed together with the gate impurity region in place of the gate threshold voltage Vth defined by the current-voltage characteristic.

In the process of manufacturing of a MESFET, generally use is made of the method using mercury probes, but here an explanation will be made of the method of measurement of the pinch-off voltage Vp of the related art using the change of capacitance of the above wide measurement pattern taking as an example the process of manufacture of a junction field effect transistor.

FIG. 10A is a plan view of the pattern after a gate diffusion step for measuring the pinch-off voltage in a process of manufacturing a junction field effect transistor of the related art. Also, FIGS. 10B to 10E are sectional views of manufacturing steps of the junction field effect transistor of the related art. The right side of each view indicates a pattern for measurement of a pinch-off voltage (a measurement use pattern) in a test element group (TEG), and the left side indicates a junction field effect transistor.

First, as shown in FIG. 10B, n-type channel forming impurity regions 101 and 101a are formed on the surface side in a semi-insulating GaAs substrate 100. In the subsequent FIG. 10C, a gate impurity region 102 of the junction field effect transistor and a source measurement impurity region 103a and drain measurement impurity region 103b of the measurement use pattern are formed. In this method of formation, first a silicon nitride film or other film is formed, opening portions 104a, 104b, and 104c are formed in this, then a diffusion mask 104 is formed. A p-type impurity, for example, zinc (Zn) is diffused from the top of this diffusion mask 104 to the substrate so as thereby to simultaneously form the gate impurity region 102, the source measurement impurity region 103a, and the drain measurement impurity region 103b. As the diffusion method, a vapor phase diffusion method using for example Zn $(C_2H_5)_2$ as the diffusion source is used.

As shown in FIG. 10D, first, a gate electrode 105 made of a stacked metal film of for example Ti/Pt/Au is formed in a manner buried in the opening portion 104a of the silicon nitride film on the gate impurity region 102. Further, ohmic electrodes 106 and 106 are formed at predetermined distances from the gate electrode 105. The formation of the ohmic electrodes 106 is achieved by making an opening in the silicon nitride film, forming a stacked metal film of AuGe/Ni on the surface of the exposed substrate, and heating this to make an alloy with the GaAs. Thereafter, a metal interconnection layer 107 for lowering the resistance is formed on the ohmic electrode 106 to thereby complete the fundamental structure of the junction field effect transistor.

In the process of manufacturing of a junction field effect transistor, the gate threshold voltage Vth of the junction field effect transistor is controlled in the diffusion step to the gate impurity region of FIG. 10C. This control is carried out by repetition of additional diffusion to the gate impurity region 102 and measurement of the pinch-off voltage Vp of the measurement use pattern until the pinch-off voltage Vp of the channel, which is correlated with the gate threshold voltage Vth, reaches the desired value.

The pattern for measurement of the pinch-off voltage Vp shown at the right side of FIG. 10A is used for this measurement.

In FIG. 10A, J1 is a first PN junction diode formed between the channel formation impurity region 101a and the source measurement impurity region 103a, while J2 is a second PN junction diode formed between the channel forming impurity region 101a and the drain measurement impurity region 103b. Two PN junction diodes J1 and J2 have a surface area sufficient for placement of the probes (for example the length of one side is about 100 to 150 μm) and have a junction capacitance large enough for measurement.

On the other hand, the dimensions of the gate impurity region 102 of the junction field effect transistor drawn at the left side of FIG. 10A are for example a length Lg of the channel direction thereof of 0.5 μm and a width Wg of the channel width direction of about 10 μm.

Accordingly, the junction areas of the PN junction diodes J1 and J2 are much larger than the junction area of the gate impurity region 102 of the junction field effect transistor.

In a pattern for measurement of the pinch-off voltage Vp configured in this way, probes are brought into sufficient contact with the source measurement impurity region 103a and the drain measurement impurity region 103b and a capacitance-voltage meter is connected between these probes. At this time, the probes are placed so that the source measurement impurity region 103a is connected to the positive pole side of the capacitance-voltage meter, while the drain measurement impurity region 103b is connected to the negative pole side.

When applying a voltage between these two probes and measuring the capacitance-voltage characteristic, the capacitance-voltage curve of FIG. 11 is obtained. In the capacitance-voltage curve of FIG. 11, an extrapolated value Vpo of the voltage V applied when the value of the detected capacitance C sharply changes becomes a voltage when the channel forming impurity region 101 is pinched off, that is, an approximation of the pinch-off voltage Vp, due to the spread of the carrier depletion region of the PN junction diode J2 on the drain side.

The principle of measurement of this pinch-off voltage Vp will be explained using FIG. 12. In FIG. 12, C11 and C21 represent the junction capacitances of the bottom surfaces of the PN junctions J1 and J2, while C12 and C22 represent the junction capacitances of the side surfaces of the PN junctions J1 and J2. Further, R1 and R2 are resistances of the channel forming impurity regions 110a just under the PN junctions J1 and J2, while V is the voltage applied via the probes.

At the time of the measurement, most of the voltage V is applied on the PN junction J2 at the negative pole side, and the carrier depletion region D2 of the PN junction J2 spreads. When the voltage V is lower than the pinch-off voltage Vpo of the channel (A point of FIG. 11), the equivalent circuit shown in FIG. 12A is obtained. The detected capacitance C of the capacitance-voltage meter is represented by the following equation:

$$C=(C11+C12)//(C21+C22) \approx C11//C22 \quad (1)$$

Here, "//" is an operation code indicating that the two capacitances Cx and Cy are connected in series and is represented as $Cx//Cy=Cx \cdot Cy/(Cx+Cy)$. As described above, C11 and C21 are large capacitances of for example about 10 pF, therefore the above approximation equation (1) stands. Also, the detected capacitance C becomes a value of substantially the same order as the junction capacitances C11 and C21.

When the applied voltage V exceeds the pinch-off voltage Vpo of the channel (B point of FIG. 11), the equivalent circuit shown in FIG. 12B is obtained and the channel is pinched off under the junction capacitance J2 the negative pole side. When the channel is pinched off, the resistor R2 at the negative pole side of the channel forming impurity region 110a becomes open and is replaced by a very small substrate capacitance Csub in the equivalent circuit. The detected capacitance C of the capacitance-voltage meter at this time is shown by the following equation:

$$C=(C11+C12)//\{(C21//Csub)+C22\} \approx C11//(Csub+C22) \approx Csub+C22 \quad (2)$$

Here, Csub is much smaller than C21, i.e., about for example 300 fF. Further, C22 is smaller than C21 by several orders due to the difference of junction areas. For this reason, the serial capacitance C21//Csub of the junction capacitance C21 and the substrate capacitance Csub is suppressed by the extremely small substrate capacitance Csub and becomes a value near Csub, while similarly C11//(Csub+C22) becomes a value near the smaller (Csub+C22). The approximation equation (2) indicate this by an equation.

As apparent from a comparison of the above two approximation equations (1) and (2), the detected capacitance C of the capacitance-voltage meter sharply changes before and after the pinch-off. Accordingly, the sharp change of the capacitance value of FIG. 11 is brought out by the pinch-off of the channel. By obtaining a grasp of this change of the capacitance, it therefore becomes possible to obtain a monitor value Vpo of the pinch-off voltage Vp. This principle of measurement is the same as in the measurement of the capacitance-voltage characteristic using mercury probes used often as the method of control of the gate threshold voltage Vth of a MESFET.

However, the pinch-off voltage Vpo measured by the above method does not match the gate threshold voltage Vth of the junction field effect transistor formed on the same substrate. Further, an unpredictable fluctuation is sometimes observed in the difference of the two (hereinafter referred to as "ΔVth").

If ΔVth is not constant, it cannot be determined how to set a target for the pinch-off voltage Vpo obtained by measuring the capacitance-voltage characteristic of the measurement pattern of FIG. 10 so as to obtain the desired gate threshold voltage Vth in the junction field effect transistor. Namely, in the method of measurement of the pinch-off voltage of the related art, there was the problem that even if the pinch-off voltage Vp was controlled taking it into account that ΔVth would become a certain value, the gate threshold voltage Vth of the actually formed junction field effect transistor would sometimes deviate from the expected value and high precision control thereof was difficult.

To solve this problem, the method of placing probes at gate pads led out from gates of the junction field effect transistor and directly measuring the gate threshold voltage Vth can be considered. However, the gate capacitance of a junction field effect transistor is for example only about several fF, therefore it is very difficult to directly and correctly measure it.

Further, there also exists the method of increasing the gate width Wg and number of gate fingers so as to increase the capacitance measured, but in this method, the amount of reduction of the capacitance at the pinch-off ends up being reduced and no sharp change in capacitance appears, therefore high precision detection of the pinch-off point is difficult. This is because the ratio of junction capacitances (ratio of junction areas) of the bottom surface with respect to the side surface of the gate impurity region 102 becomes small since the gate length Lg is made narrower. This ratio of capacitances does not change even if the gate width Wg is greatly increased. Of course, there is a more conspicuous tendency for reduction of the dynamic range of this change of capacitance as the gate length Lg is made shorter. The method of increasing the measured capacitance therefore cannot be adopted at all as the method of measurement of the gate threshold voltage Vth of a junction field effect transistor where gates are being made increasingly smaller.

In this way, the method of control of the gate threshold voltage Vth of a field effect transistor of the related art was not sufficient in precision. Particularly, in junction field effect transistors having PN junction gates or MESFETS having Schottky junction gates or other devices, it is important how precisely the gate threshold voltage Vth is controlled. Further, the number of factors causing variations in the gate threshold voltage Vth is increased in the process along with the increasing miniaturization of the gates. Accordingly, a higher precision method of control of the gate threshold voltage Vth has been demanded.

SUMMARY OF THE INVENTION

The present invention was made in consideration with these circumstances. An object of the present invention is to provide a measurement circuit and measurement transistor enabling direct measurement of the pinch-off voltage of a gate of a field effect transistor having the same gate dimensions so as to achieve high precision control of the gate threshold voltage Vth of a field effect transistor having fine gates.

Another object of the present invention is to provide a method of measurement of a pinch-off voltage using this measurement transistor and a method of manufacture of a Junction field effect transistor improving the controllability of the gate threshold voltage Vth using this measurement method.

To solve the problems of the related art and achieve the above objects, the present inventors searched for the factors behind the generation and fluctuation of the ΔVth. As a result, they concluded that the generation of the ΔVth was mainly related to the difference of dimensions between the gate junction capacitance of the junction field effect transistor and the drain side junction capacitance J2 of the measurement pattern and was brought about due to the fact that the depth of diffusion of the impurity introduced to the gate impurity region, that is, the zinc, was affected by the pattern dimensions. Namely, in vapor phase diffusion using for example an organic metal DEZ $(Zn(C_2 H_5)_2)$ as the diffusion source and using the silicon nitride film as a diffusion mask, the substrate stress due to the silicon nitride film increases the diffusion coefficient of the zinc in the GaAs substrate, therefore the finer the gate pattern, the deeper the diffusion depth and the higher the gate threshold voltage Vth for the same diffusion time. Further, they confirmed that the fluctuation in the diffusion coefficient due to this stress was the main cause of the fluctuation of the ΔVth.

It was learned from the above that one measure for suppressing the fluctuation of the ΔVth and enhancing the controllability of the gate threshold voltage Vth of a Junction field effect transistor by the method of measurement of related art was to control the substrate stress. However, the substrate stress also changes according to the thickness and quality of the silicon nitride film, the gate length, etc. It is therefore not easy to control this with the required precision.

Therefore, the present inventors engaged in various studies on a method for detecting the pinch-off voltage of a channel due to a gate impurity region of the same dimensions as that of a junction field effect transistor by a large change in capacitance as in the related art. This is because it can be considered that the gate impurity region of a junction field effect transistor is affected by the substrate stress, therefore the pinch-off voltage of the channel due to an impurity region having the same dimensions as those of this has a higher correlation with the gate threshold voltage Vth of a junction field effect transistor.

As a result of the studies, the present inventors reached the conclusion that, for a fine gate junction field effect transistor, the capacitance-voltage characteristic between the gate and source may be measured after connecting an external capacitance between the gate and drain sufficiently larger than the transistor capacitance between the gate and drain.

According to a first aspect of the present invention, there is provided a pinch-off voltage measurement circuit for measuring a pinch-off voltage of a field effect transistor, comprising a measuring means, a measuring capacitor, and a connection circuit. The measuring means applying a voltage to field effect transistor and detecting a change of impedance with respect to the applied voltage via the connection circuit for measuring the pinch-off voltage of the field effect transistor. The connection circuit comprising a first detection terminal and second detection terminal to which the measuring means is connected; a first element connection terminal to which one of the source or drain of the field effect transistor is connected; a second element connection terminal to which the other is connected; and a third element connection terminal to which the gate is connected, wherein the one detection terminal to which the measuring capacitor is connected and the third element connection terminal being short-circuited, and the measuring capacitor connected between the first detection terminal and first element connection terminal and/or between the second detection terminal and second element connection terminal and having a capacitance value sufficiently larger than the transistor capacitance between the source or drain and the gate in the field effect transistor.

According to a second aspect of the present invention, there is provided a measurement transistor formed on the same semiconductor substrate as a field effect transistor and monitoring a pinch-off voltage of the field effect transistor, having a channel forming impurity region which has substantially the same depth as the impurity region in which the channel of the field effect transistor is formed and formed on the surface side in the semiconductor substrate, a source portion and drain portion formed on the surface of the channel forming impurity region with a predetermined spacing, and a gate portion with a cross-section in the channel direction having the same structure as the field effect transistor and which contacts the channel forming impurity region in the interval of the source portion and drain portion, and a capacitance sufficiently larger than the transistor capacitance between the source or drain and the gate in the field effect transistor and which is formed on at least one side of the source portion and drain portion, and an upper electrode layer of the capacitance being connected to the gate portion via a conductive layer.

The source portion and the drain portion are measurement impurity regions of the same conductivity type as that of the gate impurity region when the field effect transistor is a PN junction gate type (JFET), or the source impurity region and drain impurity region of the reverse conductivity type as that of the gate impurity region when the field effect transistor is an insulated gate type (MOSFET etc.) In the case of a Schottky gate type (MESFET, high electron mobility transistor (HEMT), etc.), the source portion and the drain portion correspond to the Schottky junction type source electrode and drain electrode.

According to a third aspect of the present invention, there is provided a method of measurement of a pinch-off voltage of a field effect transistor, comprising connecting to at least one of a source and drain of the field effect transistor for which the pinch-off voltage is being sought a capacitance sufficiently larger than an transistor capacitance between the source or drain and the gate inside the field effect transistor from a first electrode side, applying in that state a voltage between a second electrode of the capacitance and the gate and between the other of the source and drain or a second electrode of another capacitance connected to the other of the source and drain, changing the voltage gradually and detecting a change of impedance between the terminals to which the voltage is applied, and finding the pinch-off voltage of the field effect transistor based on the result of the detection.

In this method of measurement, it is also possible to use a built-in capacitance type measurement transistor in which a short-circuit between one of the source or drain and the gate is achieved internally and a capacitance sufficiently larger than the transistor capacitance is built in.

According to a fourth aspect of the present invention, there is provided a method of manufacture of a field effect transistor comprising using a built-in capacitance type measurement transistor to measure a pinch-off voltage of the field effect transistor and, when the result of measurement does not indicate the desired pinch-off voltage, repeatedly adjusting the impurity concentration and depth of the gate impurity region and measuring the pinch-off voltage until obtaining the desired pinch-off voltage.

In the measurement circuit of a pinch-off voltage, the measurement transistor, the measurement method of the pinch-off voltage, and the manufacturing method of a field effect transistor according to the present invention, the field effect transistor whose pinch-off voltage value is desired to be learned or the measurement transistor having the same cross-sectional structure, in the channel direction, of a gate portion, including the substrate surface region, has a capacitance sufficiently higher than the transistor capacitance thereof externally connected or built-in in a state where it is short-circuited to the gate. For this reason, the channel can be pinched off in the gate impurity region earlier than the impurity region on the source side or drain side (or carrier depletion region of Schottky electrode) while keeping the measured capacitance high. Accordingly, the pinch-off voltage obtained as a result of this takes into account the value of the substrate stress etc. applied on the gate impurity region well, and the correlation with the gate threshold voltage of the field effect transistor becomes high.

BRIEF DESCRIPTION OF THE DRAWINGS

These and other objects and features of the present invention will become clearer from the following description of the preferred embodiments given with reference to the attached drawings, in which:

FIG. 1A is a plan view of a pattern for measurement of a pinch-off voltage after a gate diffusion step in a process for manufacture of a junction field effect transistor according to a first embodiment of the present invention;

FIGS. 1B to 1E are sectional views of the process for manufacture of a junction field effect transistor;

FIG. 2 is a view of a capacitance-voltage curve obtained when measuring the capacitance-voltage characteristic by bringing a positive pole side probe of a capacitance-voltage meter in contact with a source measurement impurity region of FIG. 1 and bringing a negative pole side probe in contact with a drain measurement impurity region;

FIGS. 3A and 3B are views of an equivalent circuit at the time of measurement of the capacitance-voltage characteristic overlaid on a cross-section of a measurement transistor, in which FIG. 3A shows the case of a point A of FIG. 2, while FIG. 3B shows the case of a point B;

FIG. 7 is a sectional view of the schematic structure of a measurement transistor for a MISFET according to a third embodiment of the present invention together with the connection configuration to the capacitance-voltage meter;

FIG. 8A is a circuit diagram of the configuration of a circuit for measurement of a pinch-off voltage according to a fourth embodiment of the present invention, while

FIG. 10A is a plan view of a pattern for measurement of a pinch-off voltage of the related art in comparison with a junction field effect transistor; and FIGS. 10B to 10E are sectional views of the process of manufacture of the measurement pattern in comparison with a junction field effect transistor;

FIG. 11 is a capacitance-voltage curve obtained by measurement of the capacitance-voltage characteristics using the measurement pattern of FIG. 10; and FIG. 12 is a view of an equivalent circuit in the case of measurement of the capacitance-voltage characteristic of the related art overlaid on a cross-section of a measurement transistor, in which FIG. 12A shows the case of the point A of FIG. 11 and FIG. 12B shows the case of the point B.

DESCRIPTION OF THE PREFERRED EMBODIMENTS

Figure 4:
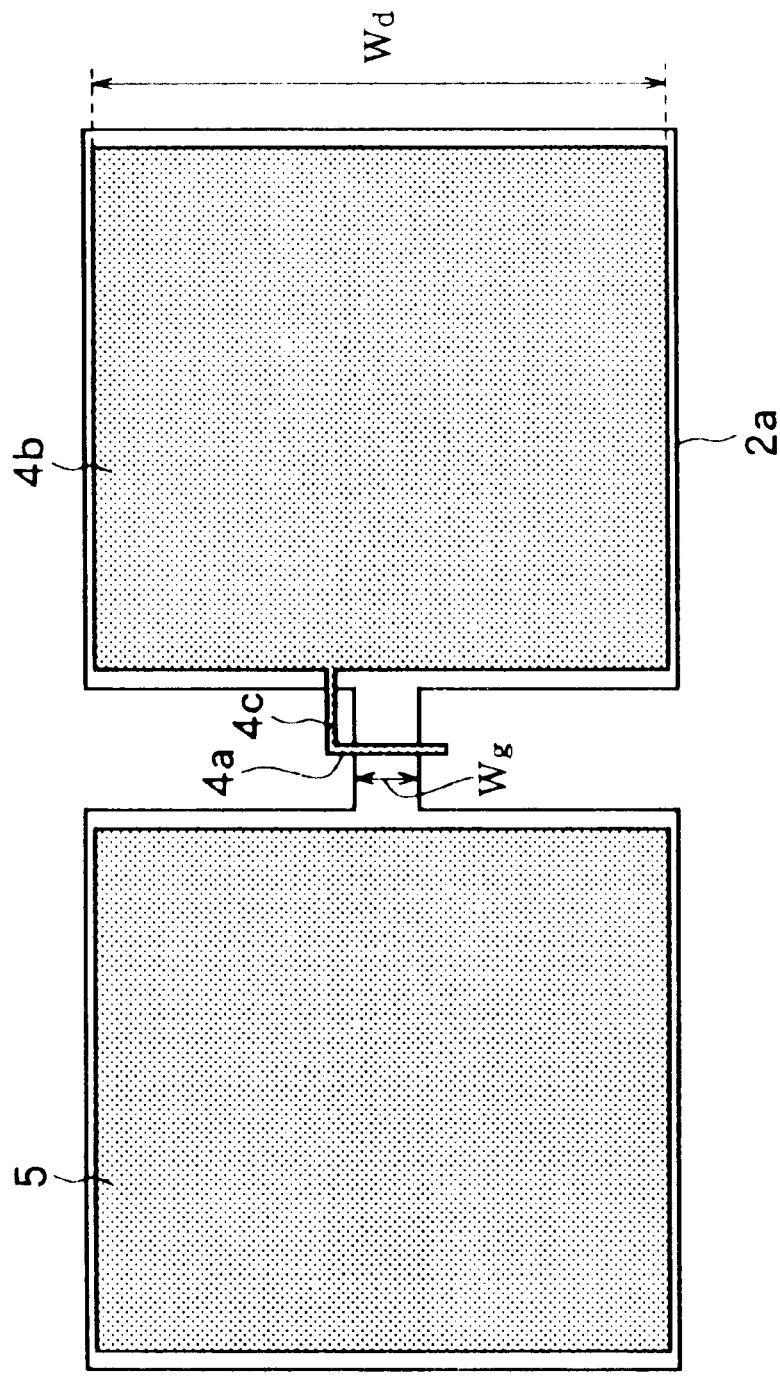
FIG. 4 is a plan view of a measurement transistor showing a modification of the first embodiment.

The present invention utilizes the structural characteristics of a field effect transistor (FET), and therefore the effect of the invention is not limited to any particular type of field effect transistor. For example, there is no limitation on the material comprising the parts of the field effect transistor, the impurity element, the gate structure (PN junction gate, Schottky junction gate, insulated gate, etc.), the dimensions and shape of the fine portions, etc. Further, the field effect transistor may be measured in any state (state of semifinished product in the wafer manufacturing process or state of finished product, and one element device or device embedded in integrated circuit).

First Embodiment

The first embodiment illustrates the measurement transistor and method of measurement of a pinch-off voltage of a field effect transistor according to the present invention in the case of a junction gate type transistor (JFET) formed on a GaAs substrate. It further relates to a method of manufacture of a junction field effect transistor according to the present invention.

FIG. 1A is a plan view of a pattern for measurement of a pinch-off voltage after a gate diffusion step in a process of manufacture of a junction field effect transistor according to the first embodiment of the present invention. Further, FIGS. 1B to 1E are sectional views of the manufacturing process of this junction field effect transistor. The right side of each figure shows the transistor for measurement of the pinch-off voltage in a test element group (TEG), while the left side shows the junction field effect transistor.

In the figures, reference numeral 1 indicates a semi-insulating GaAs substrate, while 2 and 2a indicate n-type channel forming impurity regions of a simultaneously formed junction field effect transistor and measurement transistor.

A p-type gate impurity region 3 having a gate length Lg and gate width Wg as shown in the plan view is formed near the center of the channel forming impurity region 2 of the junction field effect transistor in the width direction. As opposed to this, on the measurement transistor side, a gate and drain short-circuited type negative pole side impurity region 4 and a positive pole side source measurement impurity region 5 located on a source side are formed. The negative pole side impurity region 4 is constituted by a gate impurity region 4a (corresponding to the gate portion of the present invention) located near the center of the channel forming impurity region 2a in the width direction, a drain measurement impurity region 4b spaced to one side thereof, and a connection impurity region 4c connecting them near the center of the gate in the width direction.

Each of these negative pole side impurity region 4 and source measurement impurity region 5 provided in the measurement transistor has a p-type conductivity type and is formed simultaneously with the gate impurity region 3 of the junction field effect transistor. Accordingly, a PN junction diode is formed between the p-type impurity region 4 or 5 and the n-type channel forming impurity region 2a.

Among these, in the two measurement impurity regions 4b and 5, one side of the pattern is made for example 100 to 150 μm so that it can contact the probes and so that a sufficiently large junction capacitance can be obtained.

Further, the gate impurity region 4a has the same gate length Lg as that of the gate impurity region 3 on the junction field effect transistor side. This elongated shape is susceptible to substrate stress, therefore two gate impurity regions 3 and 4a are usually formed to deeper positions than the measurement impurity regions 4b and 5 having large PN junction areas. Note that the width of the connection impurity region 4c is made for example about the gate length Lg.

On the GaAs substrate 1, as shown in FIG. 1D, is formed a diffusion mask 6 made of a silicon nitride film or the like and opened on the p-type impurity regions 3 to 5. Further, this diffusion mask 6 has two opening portions spaced in the direction of gate length with respect to the gate impurity region 3 of the junction field effect transistor. An ohmic electrode 7 (corresponding to the source portion and drain portion of the present invention) is buried in each. These ohmic electrodes 7 are formed by alloying the stacked metal of AuGe/Ni with the GaAs substrate 1. A gate electrode 8 made of a stacked metal of Ti/Pt/Au is buried in the opening portion of the diffusion mask 6 on the gate impurity region 3 in the interval between ohmic electrodes 7. Further, as shown in FIG. 1E, a first interconnection layer 9, an interlayer dielectric film 10, and a second interconnection layer 11 are formed in that order over the ohmic electrodes 7.

In such a configuration of a measurement transistor, when compared with a junction field effect transistor, large capacitances having the large surface area measurement impurity region 4b or 5 as upper electrode layers and having the channel forming impurity region 2a as lower electrode layers are connected to channel ends of the source and drain in series. Further, since the gate and drain are short-circuited inside the substrate, the measurement transistor acts as a capacitive diode.

The measurement transistor according to the present embodiment has the advantage that since such large capacitances are formed and since a short-circuit is realized internally between the gate and drain, it is possible to prepare for measurement of the pinch-off voltage by just bringing probes from a capacitance-voltage meter or the like into contact with each of these two measurement impurity regions 4b and 5 and therefore the measurement becomes easy.

Next, an explanation will be made of the method of manufacture of this junction field effect transistor with reference to FIGS. 1B to 1E.

First, as shown in FIG. 1B, n-type channel forming impurity regions 2 and 2a are formed on the surface side in the semi-insulating GaAs substrate 1. These channel forming impurity regions 2 and 2a are formed by for example the ion implantation method, epitaxial growth method, or a method combining the same. The impurity introduced is an n-type impurity, for example, silicon (Si), but in accordance with need it is also possible to form a p-type buried region in a suitable area deep in the channel forming impurity regions 2 and 2a. As the conditions for the ion implantation and epitaxial growth, any conditions may be selected from the viewpoint of the characteristics of the junction field effect transistor intended, the leeway in the process, etc.

As shown in FIG. 1C, the gate impurity region 3 of the junction field effect transistor and the source measurement impurity region 5 and negative pole side impurity region 4 of the pinch-off voltage measurement transistor are simultaneously formed.

Specifically, first, the diffusion mask 6 for the formation of these impurity regions is formed. In the formation of this diffusion mask 6, for example, a silicon nitride film is deposited over the entire surface by a chemical vapor deposition (CVD) process. As the thickness of the silicon nitride film, a suitable thickness is selected so that the impurity introduced to the impurity regions 2, 4, and 5 does not pass through this film to reach the substrate 1. This silicon nitride film is formed with an opening portion partially opening over the channel forming region 2 or 2a for introducing the impurity. Such opening portions are formed by a photolithographic technique, a dry etching method such as reactive ion etching (RIE) using a reaction gas containing carbon tetrafluoride, a wet etching method using a fluoric acid-based etching solution, or a combination of the same. From over the diffusion mask 6 formed in this way, the p-type impurity, for example, zinc (Zn), is diffused to the substrate so as to simultaneously form the gate impurity region 3, the negative pole side impurity region 4, and the source measurement impurity region 5. As the method of diffusion, a vapor phase diffusion method using for example Zn $(C_2H_5)_2$ as the diffusion source is used.

After this first diffusion, the measurement transistor is used to control the depth and concentration of the gate impurity region 3 of the Junction field effect transistor so as to obtain the desired gate threshold voltage Vth in the junction field effect transistor. Namely, by using the measurement method explained later, the probes are brought into contact between both measurement impurity regions 4b and 5 of the measurement transistor to measure the pinch-off voltage Vpo. When this does not reach the desired pinch-off voltage Vp, additional diffusion to the gate impurity region 3 and measurement impurity regions 4 and 5 and the measurement of the pinch-off voltage Vpo are repeated until the desired pinch-off voltage Vp is obtained.

As shown in FIG. 1D, first, a gate electrode 8 made of a stacked metal film of for example Ti/Pt/Au is formed in a manner buried in the opening portion of the silicon nitride film on the gate impurity region 3. Further, a pattern of ohmic electrodes is formed at the position of the diffusion mask 6 spaced from the gate electrode 8. The stacked metal film of AuGe/Ni is formed on the substrate surface exposed by this opening portion. This is heated to alloy with the GaAs and form the ohmic electrodes 7. Next, a first interconnection layer 9 for making the resistance low is formed on the ohmic electrodes 7, whereby the basic structure of the junction field effect transistor is completed.

When producing an integrated circuit embedding a junction field effect transistor formed in this way, next, as shown in FIG. 1E, a multi-layer interconnection structure is formed by forming a second interconnection layer 11 over the inter-layer dielectric film 10. This multi-layer interconnection structure is used for the formation of passive elements such as inductors and metal-insulator-metal capacitors (MIM capacitors) in addition to the objective of effective connection with other elements.

The method of manufacture of a junction field effect transistor of the present embodiment that the advantages that the measurement transistor is formed on the same substrate by just following the usual manufacturing process of a junction field effect transistor. No additional step or photomask are required over those of the usual manufacturing process of a junction field effect transistor.

Next, the method of measurement of the pinch-off voltage using the measurement transistor will be explained.

FIG. 2 shows a capacitance-voltage curve obtained when measuring the capacitance-voltage characteristic by bringing the positive pole side probe of the capacitance-voltage meter in contact with the source measurement impurity region 5 of FIG. 1 and bringing the negative pole side probe in contact with the drain measurement impurity region 4b. Note that, in FIG. 2, the capacitance-voltage curve measured by the measurement pattern of the related art of FIG. 11 (the measurement pattern of FIG. 1 minus the gate impurity region 4a and the connection impurity region 4c) is indicated by a broken line.

A sharp change of the capacitance C detected by the capacitance-voltage meter in this FIG. 2 is generated due to the pinch-off of the channel since the carrier depletion region spreads from the gate impurity region 4a together with the increase of the voltage applied. Therefore, here, it is possible to measure the so-called gate pinch-off voltage Vp.

The reason for the occurrence of the sharp change of the detected capacitance C due to the pinch-off of the channel by the gate impurity region 4a will be explained next by using the equivalent circuit of FIGS. 3A and 3B. In FIGS. 3A and 3B, C1 and R1 are a junction capacitance and resistance of the source measurement impurity region 5 connected in series between the source measurement impurity region 5 and the source side end of the channel, C2 and R2 are a junction capacitance and resistance of the drain measurement impurity region 4b connected in series between the drain measurement impurity region 4b and the drain end of the channel, and Rch is the channel resistance. Further, Cgs, Cgd, and Cds are transistor capacitances of the measurement transistor, Cgs represents the capacitance between the source and gate, Cgd represents the capacitance between the drain and gate, and Cds represents the capacitance between the source and drain.

When a voltage is applied between the source measurement impurity region 5 and the drain measurement impurity region 4b, most of the voltage V is applied to the drain measurement impurity region 4b. A voltage the same as that of the drain measurement impurity region 4b is applied to the gate impurity region 4a since this is connected to the drain measurement impurity region 4b via the connection impurity region 4c.

When the applied voltage V does not reach the pinch-off voltage Vp of the gate impurity region 4a, as shown in FIG. 3A, since the junction capacitances C1 and C2 are connected by the channel resistance Rch, a value substantially equal to the serial capacitance of the junction capacitances C1 and C2 is measured. The capacitance C detected at the time of measurement is represented by the following equation:

$$C = C1 // (C2 + Cgs + Cgd) \approx C1 // C2 \qquad (3)$$

Here, "//" is an operation code indicating that two capacitances Cx and Cy are connected in series and is represented as $Cx//Cy = Cx \cdot Cy/(Cx+Cy)$. As described above, C1 and C2 are large capacitances of for example about 10 pF, while Cgs and Cgd are an order smaller since the junction area is small, therefore the above approximation equation (3) stands. Also, the detected capacitance C becomes a value of substantially the same order as the junction capacitances C1 and C2.

When further increasing the applied voltage V, the channel is pinched off earlier than the drain measurement impurity region 4b just under the gate impurity region 4a with the deep diffusion depth, and both sides of the channel resistance Rch becomes open. Then, the detected capacitance C changes as in the following equation:

$$C = C1//(Cgs + Cds//(Cgd + C2))) \approx C1//(Cgs + Cds) \approx Cgs + Cds \qquad (4)$$

Here, in the same way as Cgs and Cgd, Cds is so much smaller than the junction capacitances C1 and C2 having the large depletion layer widths that it can be ignored, therefore the above approximation equation (4) stands.

As apparent from a comparison of the above two approximation equations (3) and (4), the reason why a sharp change is observed in the capacitance is that when the channel is pinched off by the gate impurity region 4a, the electric character of the channel changes from a resistance to a small capacitance connected in series to the junction capacitances C1 and C2 and this becomes the upper limit of the serial capacitance of the junction capacitances C1 and C2.

This principle of measurement assumes that the pinch-off voltage Vp of the channel due to the gate impurity region 4a takes a value to the positive side from the case due to the drain measurement impurity region 4b. Namely, it uses the fact that the gate impurity region 4a is formed deeper in the substrate due to the substrate stress and therefore causes the channel to be pinched off earlier than the drain measurement impurity region 4b. In the present embodiment, it is also possible to positively produce such a difference. Various modifications can be considered concerning this.

For example, if the channel concentration just under the drain measurement impurity region 4b is made higher than the channel concentration just under the gate impurity region 4a, even if the diffusion depths of the two impurity regions 4a and 4b are the same, the pinch-off voltage Vp of the gate impurity region 4a becomes a value more positive than the case due to the drain measurement impurity region 4b, therefore the above effect (difference) making the application of the above measurement principle possible is obtained.

Further, various modifications are possible for the connection position of the connection impurity region 4c. For example, as shown in FIG. 4, the connection impurity region 4c can be extended to the top of the semi-insulating GaAs substrate 1 and connected to one end (or both ends) of the gate impurity region 4a. When the connection impurity region 4c is connected in this way, the gate impurity region 4a of the measurement transistor can be made equivalent to the gate impurity region 3 of a junction field effect transistor and therefore there is an advantage that the pinch-off voltage Vp can be measured more precisely.

Figure 5:
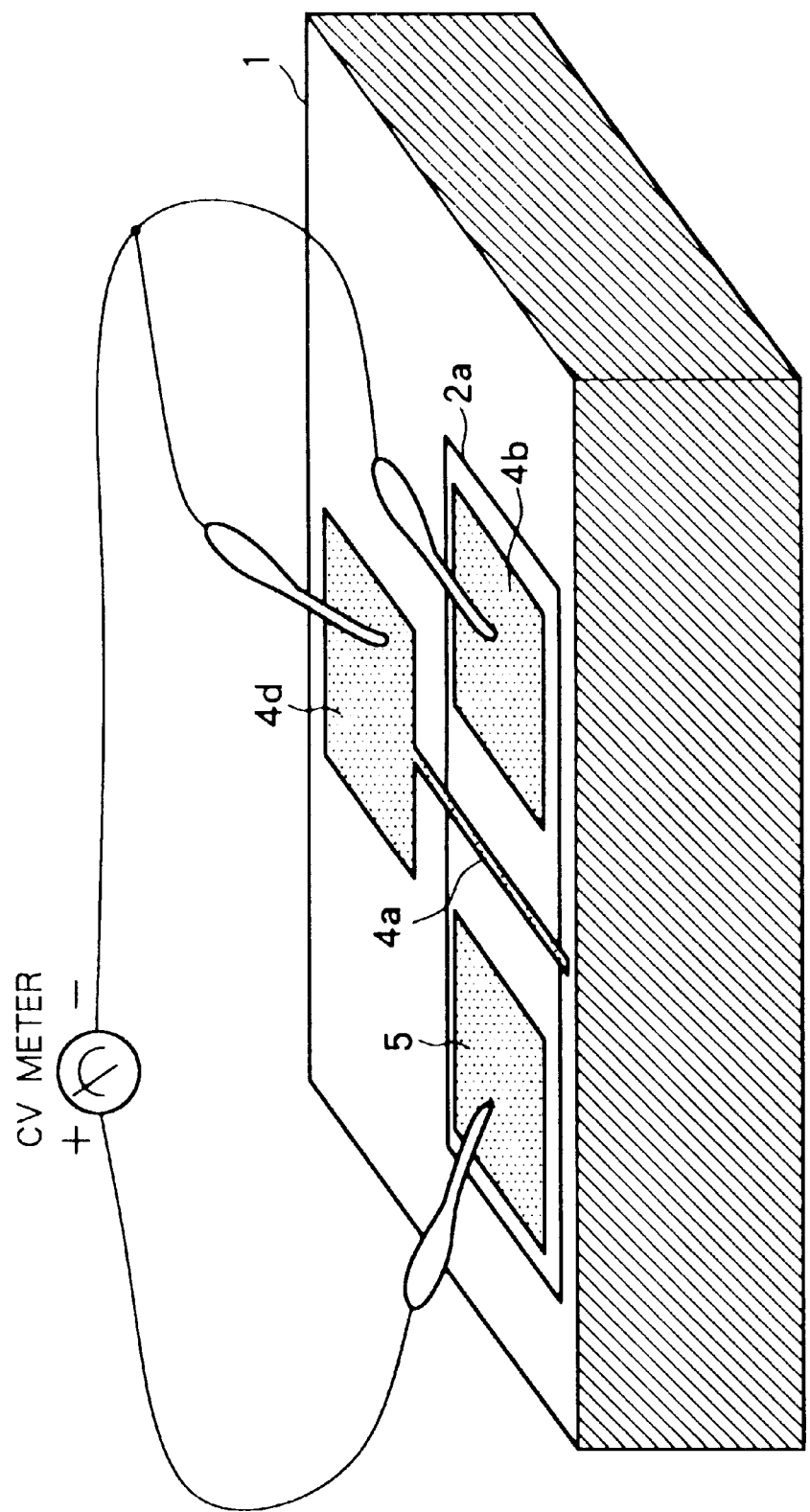
FIG. 5 is a perspective view at the time of measurement showing another modification of the first embodiment.

This connection impurity region 4c can be omitted too. In this case, it is necessary to provide a pad region 4d on the semi-insulating GaAs substrate 1 on one end of the gate impurity region 4a as shown in FIG. 5 and connect the probe contacted with this pad region 4d and the probe on the drain side outside.

Other than this, while the pinch-off voltage Vp was measured by the method of measuring the capacitance-voltage characteristic in the above explanation, the method of measurement is not limited to this. It is also possible to measure the change of voltage of the element's impedance for example and use the peak of the equivalent serial resistance component produced when the channel resistance Rch becomes open to detect the pinch-off of the channel.

According to the present embodiment, in comparison with the method of measurement of the pinch-off voltage of the related art shown in FIG. 10, the pinch-off voltage Vp of the gate can be directly measured without causing an increase of the number of manufacturing steps or causing a reduction of the detected capacitance C. As a result, higher precision control of the gate threshold voltage Vth becomes possible.

Note that, in the present embodiment, the drain junction capacitance C2 etc. were formed by the PN junction between the measurement impurity region and the channel forming impurity region, but it is also possible to realize the drain junction capacitance C2 etc. by a metal-insulator-metal (MIM) structure constituted by successively forming the lower electrode, dielectric film, and upper electrode on for example an n-type high concentration impurity region.

Second Embodiment

In the second embodiment, the present invention is applied to a Schottky type field effect transistor (MESFET, HEMT, etc.)

Figure 6:
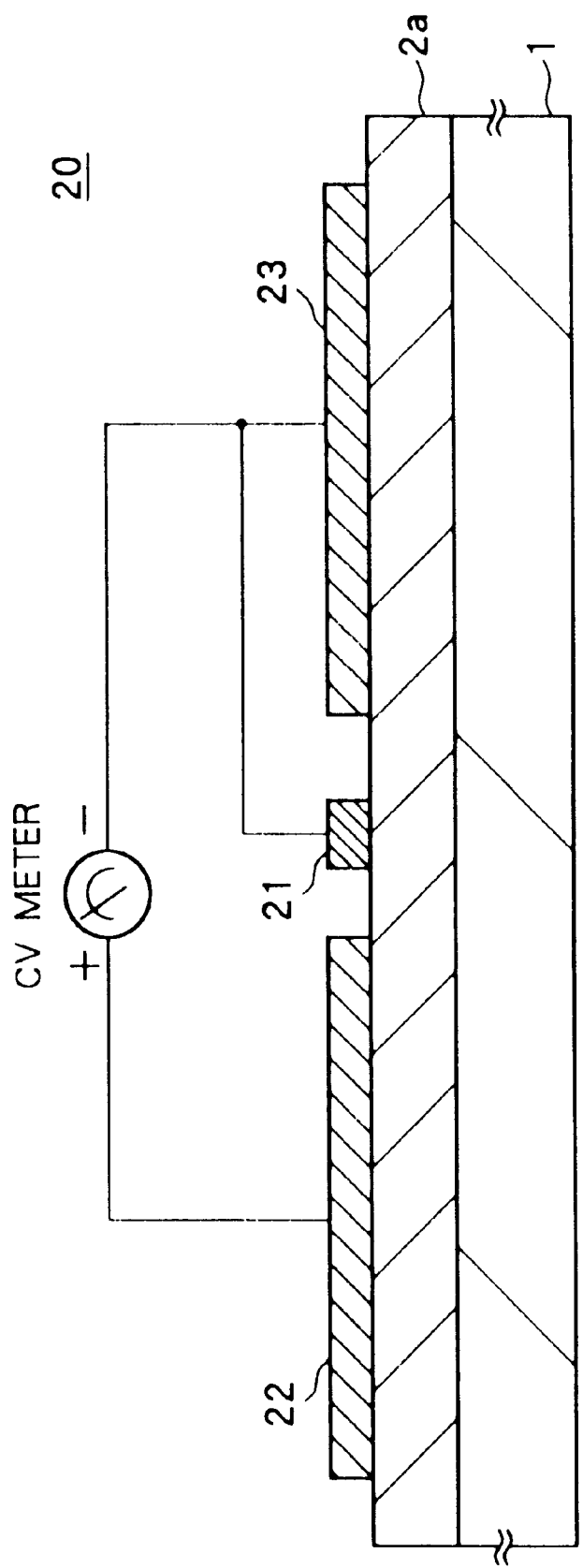
FIG. 6 is a sectional view of the schematic structure of a measurement transistor for a MESFET according to a second embodiment of the present invention together with a connection configuration to the capacitance-voltage meter.

FIG. 6 is a sectional view of the general configuration of a transistor for measurement of the pinch-off voltage arranged in a test element group (TEG) of a MESFET according to the present embodiment together with the connection configuration of the capacitance-voltage meter.

In the basic configuration relating to the measurement of the pinch-off voltage of the present invention, the present embodiment is different from the gate electrode structure in the first embodiment in the structure for realizing the source junction capacitance C1 and the drain Junction capacitance C2, but is similar to the first embodiment in the principle of measurement of the pinch-off voltage Vp.

This measurement transistor 20 is similar to the first embodiment in the point that the n-type channel forming impurity region 2a is formed on the semi-insulating GaAs substrate 1. Silicon etc. are used as the n-type impurity introduced.

In the first embodiment, the p-type gate impurity region 4a, the source measurement impurity region 5, and the drain measurement impurity region 4b were simultaneously formed in this channel forming impurity region 2a, but in the present embodiment, they are constituted by Schottky junction of electrodes. Namely, in place of the gate impurity region 4a, a gate electrode 21 is formed on the channel forming impurity region 2a. Further, in place of the source measurement impurity region 5 and the drain measurement impurity region 4b, a source electrode 22 and a drain electrode 23 are formed in a manner away from the two sides of the gate electrode 21 in the channel direction. These three Schottky junction type electrodes 21 to 23 are made of for example Ai, Ti/Pt/Au, W, etc. The gate electrode 21 and the drain electrode 23 are short-circuited by the not particularly illustrated inter-electrode connection portion made of for example a layer of metal of the same level or an external line connecting.

A voltage having the short-circuited gate and drain side as a negative pole and having the source side as a positive pole is applied to the measurement transistor 20 of this configuration, and the pinch-off voltage Vp is measured by a method similar to that of the first embodiment.

The gate electrode etc. are not formed at the MESFET side at the time of this measurement, and the state after forming the channel forming region 2 is maintained. Therefore the additional diffusion of the impurity in the channel forming impurity region 2 or the adjustment of the concentration and depth etc. by etching are carried out based on the result of the measurement of the pinch-off voltage to control the gate threshold voltage Vth of the finished product.

In the methods of controlling the gate threshold voltage of the related art, the general practice had been to measure the capacitance-voltage characteristic by mercury probes without using a test element group (TEG). Therefore, while the number of steps for formation of the Schottky junction electrodes 21 to 23 on the Field effect transistor side is increased by one in the present invention, measurement of the gate pinch-off voltage using the gate electrode 21 having the same dimensions as those of the MESFET becomes possible. Therefore, higher precision control of the gate threshold voltage becomes possible.

Note that, other than the fact that it is possible to measure a change of voltage of the element's impedance in place of measurement of the capacitance-voltage characteristic, when the prerequisite of the present invention that the pinch-off of the channel by the gate electrode 21 is earlier than the drain side is difficult to obtain, it is possible to make the concentration of the channel forming impurity region 2a on the drain side higher in the same way as in the modification of the first embodiment.

Third Embodiment

In the third embodiment, the present invention is applied to an insulated gate type field effect transistor (MISFET).

FIG. 7 is a sectional view of the general configuration of a transistor for measurement of the pinch-off voltage arranged in a test element group (TEG) of a MISFET according to the present embodiment together with the connection configuration of the capacitance-voltage meter.

The present embodiment is different from the gate electrode structure in the first embodiment in the structure for realizing the source junction capacitance C1 and drain junction capacitance C2 similar to the second embodiment, but is similar to the first embodiment in the principle of measurement of the pinch-off voltage Vp.

The channel forming impurity region in this measurement transistor 30 can be formed as a p-type impurity diffusion region on a non-doped silicon substrate too, but as shown in FIG. 7, if a p-type silicon substrate 31 is used, it is not particularly necessary to form the channel forming impurity region. The channel forming impurity region in this case means the surface region in the p-type silicon substrate 31.

In the present embodiment, the n-type source impurity region 32 and drain impurity region 33 are formed spaced apart from each other on the surface of the p-type silicon substrate 31. They constitute a lower electrode layer of a large capacitor (having the junction capacitances C1 and C2 in the first embodiment) in the same way as the measurement impurity regions 4b and 5 of the first embodiment.

On the p-type silicon substrate 31, a dielectric film 34 open on the source impurity region 32 is formed. Further, on the dielectric film 34, a gate electrode 35 is formed at a position facing the interval between the source impurity region 32 and the drain impurity region 33 (channel forming region). Further, a drain electrode 36 (upper electrode layer of the large capacitor) is formed above the drain impurity region 33 away from the gate electrode 35. The above large capacitor is comprised by these drain impurity region 33, dielectric film 34, and drain electrode 36. Further, the gate electrode 35 and the drain electrode 36 are short-circuited by a not illustrated inter-electrode connection portion or an external connection line.

With a measurement transistor 30 having such a structure, the pinch-off voltage Vp is measured by a method similar to that of the first embodiment.

Note, in the case of the present embodiment, it is necessary to not simultaneously form the gate electrode of the MISFET and the electrodes 35 and 36 of the measurement transistor 30, but to previously form the electrodes on the measurement transistor 30 side. This is because the control of the channel concentration etc. by additional implantation is difficult if there is a gate electrode of the MISFET.

In addition, when repeatedly performing the measurement of the pinch-off voltage and additional implantation by a number of times, before forming the electrodes 35 and 36 made of for example polycrystalline silicon, a plurality of measurement transistors 30 are simultaneously formed on the same substrate. After first forming the electrodes and measuring the pinch-off voltage Vp, it is necessary to form the electrodes in another measurement transistor 30 and measure the pinch-off voltage Vp with every adjustment of the channel concentration. When the desired pinch-off voltage Vp is obtained, the gate electrode of the MISFET is formed, and the control of the gate threshold voltage Vth is terminated.

In this case as well, in the same way as the second embodiment, the number of steps for formation of the gate electrode 35 etc. on the test element group (TEG) side is increased, but measurement of the gate pinch-off voltage using a gate electrode 35 having the same dimension as those of the MISFET becomes possible, therefore higher precision control of the gate threshold voltage becomes possible. Particularly, even in a case where the gate length Lg of the MISFET is extremely short, it is also possible to directly measure the pinch-off voltage Vp of the channel—determined by the difference of the work functions between the gate electrode and substrate, the thickness of the gate dielectric film, the fixed interface states, the interface carrier trapping levels, and the distribution of concentration of the impurity in the depth direction of the channel forming impurity region, etc.—without being influenced by two-dimensional effects such as a short channel effect.

Note that, in the present embodiment, in addition to the fact that it is possible to measure the change of voltage component of the element's impedance in place of measurement of the capacitance-voltage characteristic, it is also possible to interpose an electrode layer between the drain impurity region 33 and the dielectric film 34 to form an MIM type having a large capacitance.

Fourth Embodiment

The fourth embodiment relates to a circuit for measurement of the pinch-off voltage.

Figure 8A:
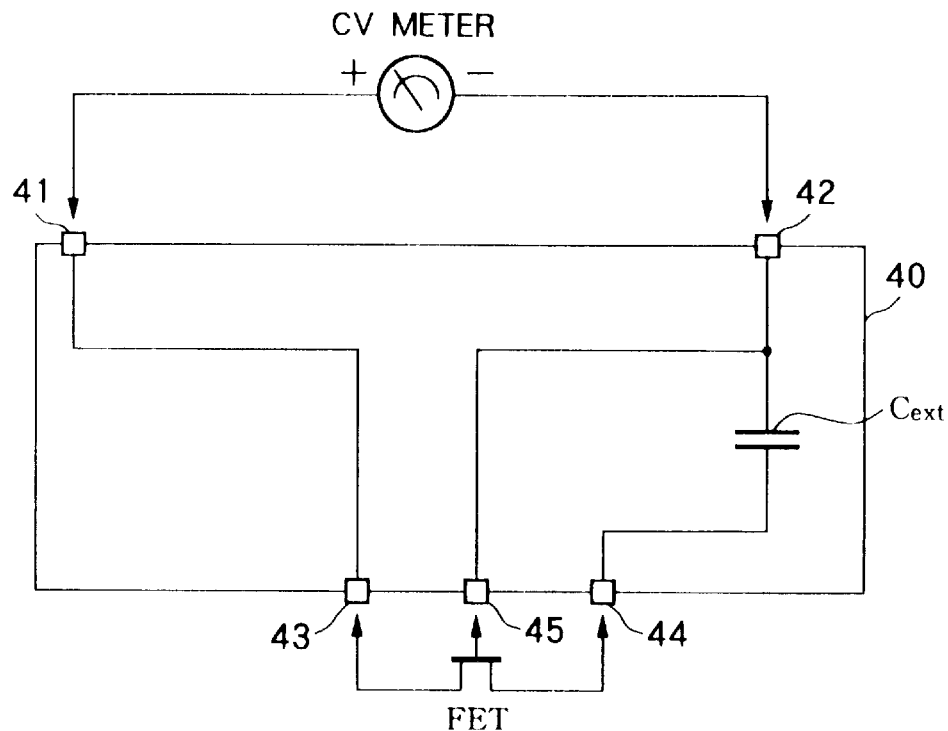
Figure 8B:
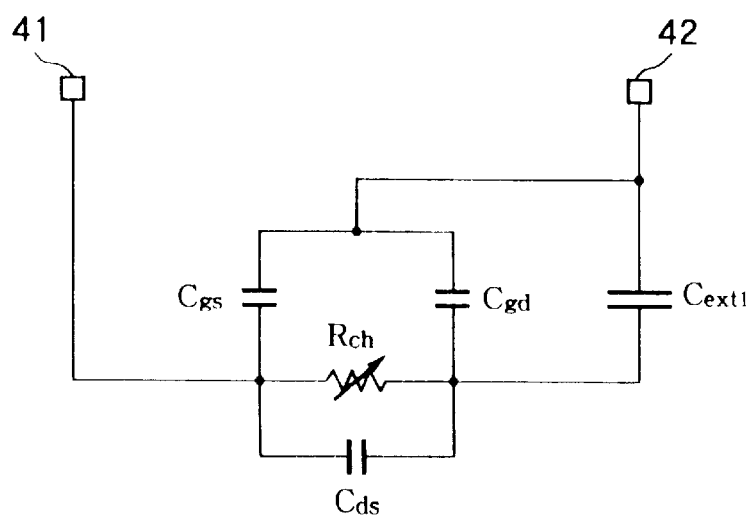
FIG. 8B is an equivalent circuit diagram in the case of connecting a field effect transistor to this measurement circuit.

FIG. 8A is a view of this measurement circuit together with the connection configuration of the N-channel type Field effect transistor and capacitance-voltage meter, while FIG. 8B is an equivalent circuit diagram of the case where an N-channel type Field effect transistor is connected.

As shown in FIG. 8A, this measurement circuit 40 has a first detection terminal 41 to which the positive pole of the capacitance-voltage meter is connected, a second detection terminal 42 to which the negative pole is connected, a first element connection terminal 43 to which the source of the Field effect transistor (drain in the case of a P-channel type) is connected, a second element connection terminal 44 to which the drain (source in the case of the P-channel type) is connected, and a third element connection terminal 45 to which the gate is connected. Among them, between the second detection terminal 42 and the second element connection terminal 44 (between the first detection terminal 41 and the first element connection terminal 43 in the case of the P-channel type), a measuring capacitor Cext1 having a capacitance value sufficiently larger than the capacitance Cgs between the source and gate and the capacitance Cgd between the drain and gate in the Field effect transistor is connected. Further, the third element connection terminal 45 and the second detection terminal 42 to which this measuring capacitor Cext1 is connected are short-circuited.

In this measurement circuit 40, it is also possible to provide another measuring capacitance Cext2 having a large capacitance value similar to the measuring capacitance Cext1 between the first detection terminal 41 and the first element connection terminal 43.

Figure 9:
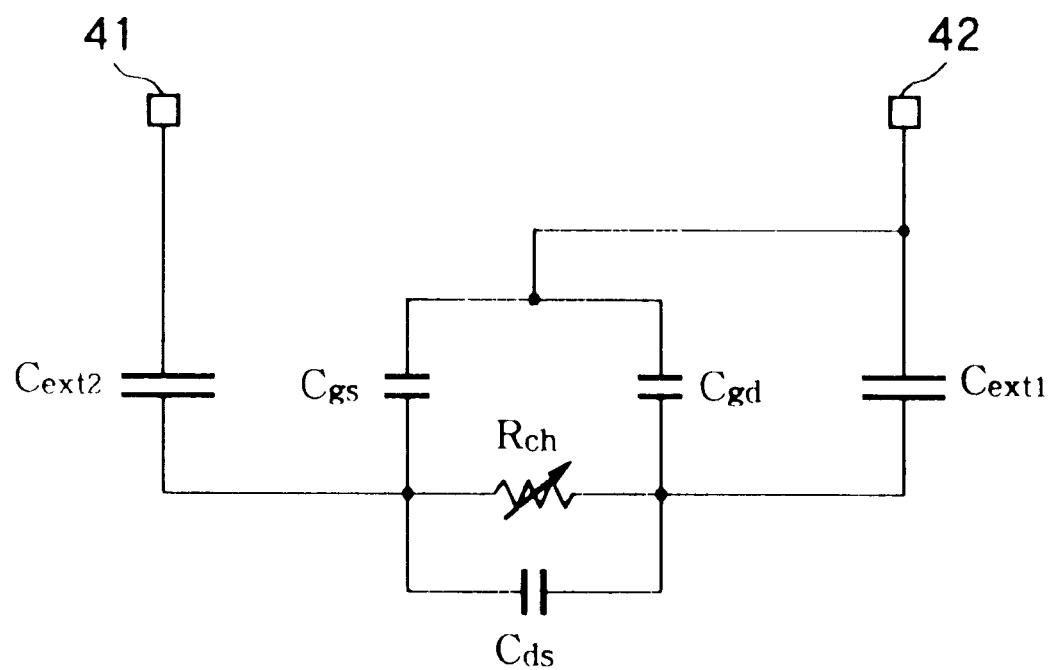
FIG. 9 is an equivalent circuit diagram in the case of connecting a field effect transistor to the measurement circuit showing a modification of the fourth embodiment.

FIG. 9 is an equivalent circuit diagram of this case. The equivalent circuit diagram of FIG. 9 corresponds to the equivalent circuit diagram of the first embodiment (FIG. 3A). Namely, the measuring capacitor Cext1 corresponds to the drain junction capacitance C2, and the measuring capacitor Cext2 corresponds to the source junction capacitance C1. Note that, in FIG. 9, the serial resistances R1 and R2 on the source and drain sides are omitted.

The principle of measurement of the pinch-off voltage Vp of a field effect transistor by this measurement circuit 40 is similar to that of the first embodiment. Similar effects to those by the first embodiment, for example, the ability to directly measure the pinch-off voltage Vp of the gate, are obtained by this.

As explained in detail above, according to the circuit for measurement of a pinch-off voltage, measurement transistor, and measurement method of the present invention, it becomes possible to directly measure the pinch-off voltage in a single isolated fine gate by measurement of the capacitance-voltage characteristic or the like while keeping the detected capacitance value large in both the field effect transistor itself for which the pinch-off voltage of the gate is sought and the measurement transistor having substantially the same gate structure as that of this field effect transistor, As a result, by applying the present invention to the process of manufacturing a field effect transistor, it is possible to improve the controllability of the gate threshold voltage. If the measurement transistor of the present invention is used in this manufacturing process, since it is easy to form the above measurement circuit in the product (wafer) in the middle of manufacture, the pinch-off voltage of the gate can be easily measured by just connecting a measuring means (capacitance-voltage meter or the like) to this. Particularly, with a measurement transistor for an insulated gate type field effect transistor, it becomes possible to measure the pinch-off voltage of the gate, determined by just the parameters in the depth direction such as the channel impurity concentration, difference of work functions, etc., without being influenced by two-dimensional effects such as the short channel effect, even for single isolated fine gates for which measurement had previously been impossible.

According to the process for manufacturing a junction field effect transistor of the present invention, it becomes possible to simultaneously form gate impurity regions to be controlled in concentration, dimension (included depth), etc. in both the measurement transistor and the junction field effect transistor, directly measure the pinch-off voltage of the channel due to this, and adjust the diffusion amount, etc. of the gate impurity while monitoring this measurement value. By this, it becomes possible to control the gate threshold voltage without being influenced by factors caused by the difference of the gate dimensions (for example, substrate stress) and the precision is improved. In the manufacturing process of the present invention, further, no additional manufacturing step is required for the measurement transistor and it becomes possible to measure the pinch-off voltage by just connecting a measuring means (capacitance-voltage meter or the like), therefore the manufacture and measurement are easy.

What is claimed is:

1. A pinch-off voltage measurement circuit for measuring a pinch-off voltage of a field effect transistor, said circuit comprising:

a measuring means, a measuring capacitor, and a connection circuit, wherein, said measuring means applies a voltage to said field effect transistor and detects a change of impedance with respect to the applied voltage via said connection circuit for measuring the pinch-off voltage of said field effect transistor, and said connection circuit comprises:

a first detection terminal and second detection terminal to which said measuring means is connected, one side of a measuring capacitor being connected to one of said detection terminals;

a first element connection terminal to which one of the source and drain of said field effect transistor is connected;

a second element connection terminal to which the other of the source and drain is connected; and a third element connection terminal to which the gate is connected, the one detection terminal to which said measuring capacitor is connected and the third element connection terminal being short-circuited, an opposite side of said measuring capacitor being connected to one of said first element connection terminal and said second element connection terminal and having a capacitance value sufficiently larger than the transistor capacitance between the source or drain and the gate in said field effect transistor.

2. A measurement transistor formed on the same semiconductor substrate as a field effect transistor and monitoring a pinch-off voltage of the field effect transistor, having:

a channel forming impurity region which has substantially the same depth as the impurity region in which the channel of the field effect transistor is formed and formed on the surface side in the semiconductor substrate;

a source portion and drain portion formed on the surface of the channel forming impurity region with a predetermined spacing; and a gate portion with a cross-section in the channel direction having the same structure as the field effect transistor and which contacts the channel forming impurity region in the interval of the source portion and drain portion; wherein a capacitor having a capacitance value sufficiently larger than a transistor capacitance of the field effect transistor between one of the source and drain and the gate in the field effect transistor and which is formed on at least one side of the source portion and drain portion, and an upper electrode layer of the capacitor being connected to the gate portion via a conductive layer.

3. A measurement transistor according to claim 2, wherein:

said field effect transistor is a junction field effect transistor;

said measurement transistor has as said gate portion a gate impurity region which has a reverse conductivity type to that of said channel forming impurity region and is formed at the surface in said channel forming impurity region;

said source portion and drain portion are a source measurement impurity region and a drain measurement impurity region which have the same conductivity type as that of said gate impurity region, are formed at the surface in said channel forming impurity region, and form a capacitor having a capacitance value sufficiently larger than said transistor capacitance by the junction with the channel forming impurity region; and said conductive layer is constituted by a connection impurity region for partially connecting one of the two measurement impurity regions and said gate impurity region.

4. A measurement transistor according to claim 2, wherein:

said field effect transistor is a Schottky gate type field effect transistor;

said source portion and drain portion of said measurement transistor are a source electrode and a drain electrode which are Schottky joined on said channel forming impurity region and form a capacitor having a capacitance value sufficiently larger than said transistor capacitance with said channel forming impurity region by the Schottky junction; and said conductive layer is constituted by an inter-electrode connection portion for partially connecting one of the source electrode and drain electrode to said gate portion.

5. A measurement transistor according to claim 2, wherein:

said field effect transistor is an insulated gate type field effect transistor;

one of said source portion and drain portion of said measurement transistor is an impurity region which is located at the surface side in said channel forming impurity region, has the same conductivity type, and constitutes a lower electrode layer having a capacitance value sufficiently larger than said transistor capacitance;

the upper electrode layer of said capacitance is formed on the impurity region via a dielectric film; and said conductive layer is constituted by the inter-electrode connection portion for partially connecting the upper electrode layer and said gate portion.

6. A measurement transistor according to claim 2, wherein said capacitor having a capacitance value sufficiently larger than said transistor capacitance is formed by successively forming the lower electrode layer, dielectric film, and upper electrode layer on a semi-insulative semiconductor substrate or a dielectric film on a semiconductor substrate.

7. A method for measuring a pinch-off voltage of a field effect transistor, said method comprising the steps of:

providing first and second capacitors, each of which has first and second electrodes, and each of which has a capacitance sufficiently larger than a transistor capacitance between either of a source and drain of the transistor and a gate of the transistor;

connecting the first electrode of the first capacitor to one of the source and drain of the field effect transistor, providing a first terminal and connecting the second electrode of the first capacitor to the first terminal, connecting the first electrode of the second capacitor to the other of the source and drain of the field effect transistor, providing a second terminal and connecting the second electrode of the second capacitor to the second terminal, connecting the gate of the field effect transistor to the second electrode of one of the first and second capacitors, applying a voltage between the first and second terminals, changing the voltage gradually and detecting a change of impedance between the first and second terminals, and finding the pinch-off voltage of the field effect transistor based on the result of the detection.

8. A method according to claim 7, comprising the steps of:
providing a measurement transistor having (a) a channel forming impurity region which has substantially the same depth as the impurity region of the field effect transistor for which the pinch-off voltage is to be sought and which is at the surface side in the same semiconductor substrate as said field effect transistor, (b) a source portion and drain portion formed on the surface of said channel forming impurity region with a predetermined spacing therebetween, and (c) a gate portion with a cross section in channel direction having substantially the same structure as that of said field effect transistor, contacting said channel forming impurity region in the spacing between said source portion and drain portion, forming said capacitors on at least one side of said source portion and drain portion, and forming an upper electrode layer of said capacitors on said at least one side and connecting one of said second electrodes of said first and second capacitors to said gate portion via a conductive layer.

9. A method according to claim 7, wherein said measuring means detects a change in capacitance.

10. A method of manufacturing a junction field effect transistor by forming a first channel forming impurity region of a first conductivity type in which the channel is to be formed at the surface side in the semiconductor substrate, then forming a first gate impurity region of a second conductivity type in a part of the first channel forming impurity region where the first gate electrode is to be formed, comprising the steps of:

forming a second channel forming impurity region of the first conductivity type in a measurement pattern forming region of the semiconductor substrate simultaneously with the formation of said first channel forming impurity region;

at the time of formation of said first gate impurity region, simultaneously forming, in said second channel forming impurity region in said measurement pattern forming region: (1) at least a second gate impurity region having substantially the same width in the channel direction as said first gate impurity region, (2) a source measurement impurity region and drain measurement impurity region of the second conductivity type which have surface areas for a capacitor having a capacitance value sufficiently larger than the transistor capacitance between one of the source and drain and gate in said junction field effect transistor, said source and drain measurement impurity regions being spaced a predetermined distance from both sides of said second gate impurity region in the channel direction, and (3) a connection impurity region of a second conductivity type which short-circuits one of the source and drain measurement impurity regions and said second gate impurity region in said second channel forming impurity region;

applying a voltage between said source and drain measurement impurity regions, detecting a change of impedance between said source and drain measurement impurity regions while gradually changing the voltage, and finding the pinch-off voltage of said junction field effect transistor based on the result of detection; and adjusting the impurity concentration and depth of said gate impurity region and the measurement of said pinch-off voltage until a desired pinch-off voltage is obtained.

11. A method of manufacturing a junction field effect transistor according to claim 10, wherein said semiconductor substrate is constituted by a Group III–V compound semiconductor material; and the impurity introduced to said gate impurity region is zinc.

* * * * *